United States Patent [19]

Nakayama et al.

[11] Patent Number: 5,554,911
[45] Date of Patent: Sep. 10, 1996

[54] LIGHT-EMITTING ELEMENTS

[75] Inventors: Takahiro Nakayama, Hitachi; Atsushi Kakuta, Hitachioota; Takao Iwayanagi, Tokyo, all of Japan

[73] Assignee: Hitachi, Ltd., Tokyo, Japan

[21] Appl. No.: 214,767

[22] Filed: Mar. 18, 1994

[30] Foreign Application Priority Data

Mar. 18, 1993 [JP] Japan .................................... 5-058767

[51] Int. Cl.⁶ ...................................................... H01J 1/70
[52] U.S. Cl. .......................... 313/504; 313/503; 428/690
[58] Field of Search ..................... 313/504, 503, 313/505, 506, 507, 508, 509; 372/7, 99, 42; 428/690, 917; 359/838; 385/47, 131

[56] References Cited

U.S. PATENT DOCUMENTS

| | | | |
|---|---|---|---|
| 3,579,142 | 7/1971 | Smiley et al. | 372/7 |
| 4,914,348 | 4/1990 | Kameyama et al. | 313/509 |
| 4,945,009 | 7/1990 | Taguchi et al. | 428/690 |
| 4,983,469 | 1/1991 | Huzino et al. | 428/690 |
| 4,987,339 | 1/1991 | Robertson | 313/502 |
| 4,995,043 | 2/1991 | Kuwata et al. | 372/7 |
| 5,115,441 | 5/1992 | Koph et al. | 372/45 |
| 5,182,491 | 1/1993 | Taguchi et al. | 313/503 |
| 5,182,788 | 1/1993 | Tanaka | 385/131 |
| 5,226,053 | 7/1993 | Cho et al. | 372/45 |
| 5,294,869 | 3/1994 | Tang et al. | 313/504 |
| 5,294,870 | 3/1994 | Tang et al. | 313/504 |
| 5,341,153 | 8/1994 | Benzschawel et al. | 345/152 |
| 5,343,542 | 8/1994 | Kash et al. | 385/31 |
| 5,363,393 | 11/1994 | Uomi et al. | 372/45 |
| 5,405,710 | 4/1995 | Dodabalapur et al. | 428/690 |
| 5,466,950 | 11/1995 | Sugawara et al. | 257/94 |

FOREIGN PATENT DOCUMENTS 0550063  12/1992  European Pat. Off. ........ H05B 33/14

OTHER PUBLICATIONS

Fukad et al. "A Dual Color Basis Tunable Color El Device Employing ZNS: Tb, F/ZnS; Mn Stacked Phosphor Layers with Color Filters" IEEE Transactions on Electron Devices vol. 40 No. I Jan. 1993 pp. 64–68.

Uchida "Present and Future Trend of Electron Device Technology in Flat Panel Display" 1991–IEEE IEDM pp. 1.2.4–1.2.5.

"Control of Emission Characteristics in Organi Thin–Film Electroluminescent Diodes Using an Optical–Microcavity Structure", N. Takada et al., Appl. Phys. Lett. 63 (15), Oct. 11, 1993, pp. 2032–2034.

"Oganic Photo—and Electroluminescent Devices With Double Mirrors", T. Nakayma et al., Appl. Phys. Lett. 63 (5), Aug. 2, 1993, pp. 594–595.

*Primary Examiner*—Alvin E. Oberley
*Assistant Examiner*—Lawrence O. Richardson
*Attorney, Agent, or Firm*—Antonelli, Terry, Stout & Kraus

[57] ABSTRACT

A multi-color light-emitting element has at least two optical micro-cavity structures having respectively different optical lengths determining their emission wavelengths. Each micro-cavity structure contains a film of or organic material as a light-emitting region, which may be a single film of uniform thickness in the element.

27 Claims, 1 Drawing Sheet

LIGHT-EMITTING ELEMENTS

BACKGROUND OF THE INVENTION

1. Field of the Invention

The present invention relates to light emitting elements employing optical microcavities. Such an element may be used, for example, as a display element, a light-emitting device for data communication, a read/write head for data files, or a printing device and the like in the field of delta communication.

2. Description of the Prior Art

In known light-emitting elements employing organic material only one emission spectrum, which depends: upon the nature of the fluorescent material, can be obtained when the light emitted from the organic thin fluorescent film is used directly. It is possible to provide a color filter in front of the light emitting element, to remove part of the emission spectrum. However, the peak intensity of the light obtained is then smaller than the intensity of emission spectrum when no color filter is used, so that the efficiency is greatly decreased. There has been proposed, for instance, in JP-A-57-51781 an electroluminescent cell in which an organic light-emitting material and an electrically insulating binder are interposed between transparent substrates having transparent electrodes such as indium tin oxide. This device does not employ the micro-cavity principle described below.

There has further been proposed a multi-color light-emitting electroluminescent element which has a plurality of inorganic light-emitting layers of different emission colors that are formed on the same substrate by utilizing different dopants in zinc sulfide (JP-B-5-15073). This element also does not use the micro-cavity phenomenon.

The concept of optical micro-cavities, which is employed in the present invention, is known. In an optical micro-cavity, the optical length is sufficiently small that it determines the peak wavelength of the emitted light. Attempts have been made to develop such devices for both spontaneous emission and stimulated emission (as in a laser device). Such a device has been realized using the inorganic semiconductor GaAs, but is expensive to make and is inapplicable to the production of a multi-color light-emitting device, because of the narrow emission frequency range of GaAs.

Applied Physics Letters 63 (5), PAGES 594–5, T Nakayama et al. "Organic-photo and electro-luminescent devices with double mirrors", an article published August 1993, describes an earlier development in this field by one of the present inventors and others which also forms the subject matter of PCT/JP93/01342 (expected to be published in March 1994). Reference should be made to this published article, which describes optical micro-cavity effects in devices containing organic thin films, for background information in relation to the present invention.

SUMMARY OF THE INVENTION

The present invention seeks to provide a multi-color light-emitting element which provides good performance and which can be fabricated relatively cheaply. In particular, the invention seeks to provide devices having an improved spectral width.

Another object of the invention is to provide a substrate for the light-emitting element of the invention.

The invention consists in providing at least two optical micro-cavity structures, having different emission wavelengths determined by their respective optical lengths, and each having an organic material film as a light-emitting region. The light-emitting film can have the same thickness in the different optical micro-cavities, with the different optical lengths being provided by different thicknesses of another film in the optical micro-cavity structure. The organic material films may therefore be formed by a single layer of uniform thickness in all the optical micro-cavity structures.

An optical micro-cavity, as used in the present invention generally has a thin film of light-emitting material, and at least two reflecting surfaces on opposite sides of the thin film, with the spacing of the two reflecting surfaces determining the optical length of the micro-cavity. The micro-cavity also has a path for light emission, which may be for example a half-mirror forming one of the reflecting surfaces alternatively, this path may be a light-emitting aperture in a layer providing one of the reflecting surfaces, for example, a non-transparent electrode layer.

One or more other layers may optionally be provided between the two reflecting surfaces, and these must be transparent layers, for example one or more of a transparent electrode, a hole-injection layer, an electron-injection layer and a spacer layer. The function of the spacer layer is to contribute to the desired optical length of the particular micro-cavity. The hole injection layer and the electron-injection layer (if provided) improve the efficiency of the device. The micro-cavity structure employed in the present invention may be of the light-excited type, in which the light emission of the organic material is stimulated by light, e.g. external laser light. In this case, electrodes are not required in the optical micro-cavity structure. Alternatively, the element can be of the current-induced type, in which electrical current is applied across the organic material thin film in each optical micro-cavity structure, to cause the desired light emission; for this, electrodes are required.

The preferred minimum optical length of the micro-cavity is one-quarter of the peak wavelength of the emitted light, since a shorter optical length may not produce the desired emission. In the present state of fabrication technology for such devices, a preferred maximum optical length is ten times the emission peak wavelength, but in all cases it is required that the optical length of the micro-cavity is such that the optical length determines the peak wavelength. That is to say, if the optical length is too great, the peak wavelength may be determined by the natural emission spectrum of the organic material.

Throughout the specification and claims, the expression 'optical length' relates not to the physical dimensions of the optical micro-cavity, but to the sum of the products of the thickness and the refractive index of each layer between the reflecting surfaces.

The organic material employed for the light-emitting region of each optical micro-cavity in the element of the invention is in general a synthetic organic material selected to have a natural light-emission spectrum having the wavelength desired. Preferably, a single organic material is used for all the optical micro-cavity structures (i.e. all pixels) of the element, this organic material having a natural emission spectrum containing the desired wavelengths of all the micro-cavity structures. Suitable organic materials are known from the field of electro-luminescence, and include metal chelate materials, other organic compounds having appropriate light-emitting properties, and polymers having appropriate light-emitting properties. Reference may be made, for example, to "Development strategies for organic electroluminescence devices" published by Science Forum, Ltd. in Japan on 30th of June 1992, page 100. The exact nature of the material is not so important as its optical properties, but preferred materials are those which can suitably be formed into thin layers having highly uniform thickness and a smooth surface.

Where electrodes are provided in the optical micro-cavity structure, the positive electrode is preferably a transparent material having a high work-function, whereas the negative electrode may be a non-transparent metal of relatively low-work function, which also provides a reflecting surface.

Preferably one reflecting surface of the optical micro-cavity is provided by a half-mirror, i.e. a semi-transparent layer structure. A half-mirror is a layer (which may be a plurality of films) which partially reflects light of appropriate wavelength at its surface. Preferably, the reflectance (i.e. nontransmittance) of the half-mirror is in the range 50 to 99.9%, but this range is not limitative. A reflectance of less than 50% is not preferred for a display device, but may be appropriate in other devices. The half-mirror has two functions, one of which is to allow the output of emitted light from the optical micro-cavity, and the other of which is to form a reflecting surface bounding the optical micro-cavity.

The multi-color light-emitting element of the present invention may emit light in the ultra-violet region, the visible region or the infrared region. Electro-luminescent materials suitable for use in the invention, providing emission wavelengths over this wide range, are already known.

In another aspect, the invention provides a substrate for use in the manufacture of a multi-color light-emitting element, comprising a transparent substrate, a half mirror structure formed on the substrate and consisting of a plurality of dielectric films and a transparent conductive layer formed on the half mirror structure.

BRIEF INTRODUCTION OF THE DRAWINGS

Embodiments of the invention will now be described by way of non-limitative examples with reference to the accompanying drawings, in which.

DESCRIPTION OF PREFERRED EMBODIMENTS

Embodiment 1

Figure 1:
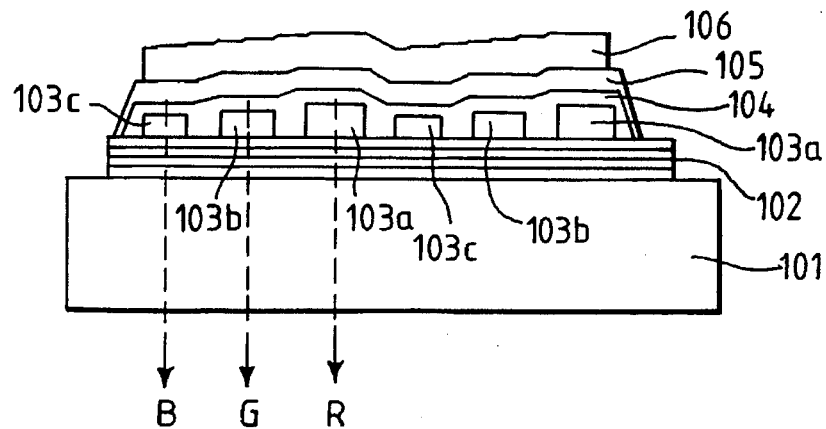
FIG. 1 is a diagrammatic illustration of the layers of a first embodiment of the present invention.

In FIG. 1, a half mirror in the form of a semitransparent reflecting layer 102 is formed on a quartz glass substrate 101 by depositing alternately $TiO_2$ films (each 56 nm thick) and $SiO_2$ films (each 89 nm thick) as a multilayer made up of a plurality of each type of film. On the layer 102 are formed, in sequence, a transparent conductive film 103 of ITO (indium-tin oxide) in the form of regions 103a, 103b, 103c having three different thicknesses, a hole-injection layer 104 of a triphenyl diamine derivative (TAD) 50 nm thick, an organic light-emitting layer 105 of an aluminum chelate ALQ (tri(8-hydroxy-quinolinol)aluminum) 50 nm thick and an metal electrode 106 (alloy of 50% Ag, 50% A plurality of the ITO electrodes 103 and of the Ag:Mg metal electrodes 106 are provided in the form of strips which intersect at right angles to constitute a matrix. When a DC voltage of 10 to 15 V is applied to the film 103 as the positive electrode and the electrode 106 as the negative electrode, the portions where the electrodes intersect serve as pixels for emission of light from the optical micro-cavity structures formed between the electrode 106 and the semitransparent layer 102. Here, the sum d of optical lengths obtained from the products of the respective thicknesses of layers 103, 104, 105 and the respective refractive indexes thereof, lies for each microcavity in a range between 450 nm and 700 nm, which is the range of the emission spectrum of ALQ when there is no semitransparent reflecting film 102.

Figure 2:
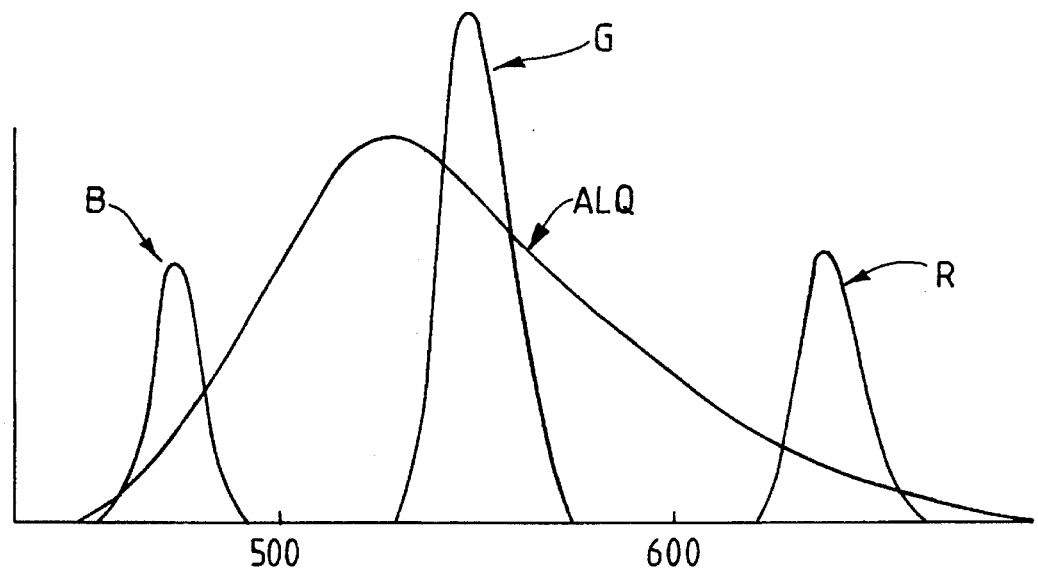
FIG. 2 is a graph showing the emission spectra of ALQ when there is no semitransparent reflecting film and also showing the emission of red, green and blue light obtained in an embodiment of the invention such as that of FIG. 1.

FIG. 2 shows the emission spectrum of ALQ when there is no semitransparent reflecting film i.e. its natural spectrum. The value d for each micro-cavity is changed by changing the thickness of the transparent conduction film 103, so that the peak in the resonance wavelength of the optical microcavity is set as desired in the range between 450 nm and 700 nm. As indicated, three colors, i.e., red (R), green (G) and blue (B) are taken out from the single element of FIG. 1.

To give a specific example, using ITO for the films 103a, 103b, 103c of refractive index 1.7, the following peaks were obtained, as shown in FIG. 2: R 620 nm, G 520 nm, B 470 nm, using thicknesses of the films 103a, 103b, 103c of 190 nm, 160 nm and 145 nm, respectively.

Depending upon the gain of the optical micro-cavity in this case, it is possible to obtain light which is stronger in intensity than the spectral components of light emitted from ALQ when there is no semitransparent reflecting film. The peak in the resonance waveform of the optical micro-cavity can be changed by changing the sum d of the optical lengths.

It is to be understood that the sum d of optical lengths can be altered in other ways than by changing the thickness of the transparent conduction film 103.

Sputtering processes may be used for forming the layers 102,103 and vacuum deposition for the layers 104,105,106.

Embodiment 2

Figure 3:
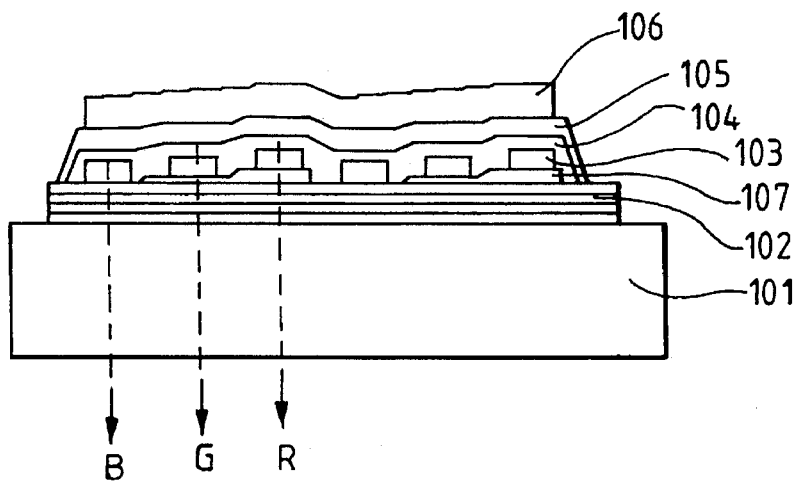
FIG. 3 is a diagrammatic illustration of the layers of a second embodiment of the present invention.

In FIG. 3 parts which have the same reference numerals as in FIG. 1 are identical to those described for FIG. 1, and will not be described again. The film thicknesses of the transparent conduction film (ITO) 103, hole-injection layer 104 of the diamine derivative (TAD), and light-emitting layer 105 of the aluminum chelate (ALQ) are constant. The sum d of optical lengths is changed by installing spacers 107 of transparent $SiO_2$ (refractive index 1.4) in order to obtain the emission of red (R), green (G) and blue (B) light. The thicknesses of the layers 104 and 105 are the same as in Embodiment 1. The ITO film 103 is 145 nm thick. The $SiO_2$ spacers 107 have the following thicknesses, for the red (R), green (G) and blue (B) lights:

|  | $SiO_2$(107) |
| --- | --- |
| B(470 nm) | 0 nm |
| G(520 nm) | 18 nm |
| R(620 nm) | 54 nm |

The intensity of resonance and the half-value width of the spectrum are determined by a combination of the emission spectrum when there is no semitransparent reflecting film with the effect of the semitransparent reflecting film having transmission/ reflection characteristics. It is, therefore, possible to set the intensity of resonance of the emitted light and the half-value width of the spectrum by determining the transmission/reflection characteristics of the semitransparent reflecting film, and to bring the intensities of the emitted red, green and blue light closer to the intensity ratio that is required for a display device.

When using the element according to the present invention as a display device, peak positions of the lights of the 5 colors may shift in accordance with the angle (visual angle) formed by the line of sight and the plane of the pixels due to the structure of the display. This stems from the fact that the sum d of optical distances effectively changes when the pixel is viewed from an oblique direction. This can be solved by setting in advance the sum d of optical distances by taking into consideration the difference in visual angle between the center of the substrate and the periphery thereof.

Embodiment 3

A multi-color light-emitting micro-cavity element is made exactly as in Embodiment 1 except that a porphyrin derivative is used in place of ALQ, for the layer 105. The same voltage is applied, to produce emission of red, green and blue light in the same manner.

The invention has been illustrated by several embodiments, but is not limited to them, and modifications and variations are possible within the scope of the invention.

It is mentioned, for example, that $Ta_2O_5$ may be used instead of $TiO_2$ in the ITO half mirror layer 102. Instead of the ITO layer, a very thin metal layer, e.g. of Ag or Au which acts as a half-mirror may be employed.

What is claimed is:

1. A multi-color light-emitting element comprising a first optical micro-cavity structure having a first film of organic material providing a light-emitting region thereof and an optical length determining its emission wavelength, and a second optical micro-cavity structure having a second film of organic material providing a light-emitting region thereof and an optical length, different from said optical length of said first micro-cavity structure, determining its emission wavelength, whereby said emission wavelengths of said first and second optical micro-cavity structures are different from one another to provide multi-color light emission.

2. A multi-color light-emitting element according to claim 1, wherein said first film of organic material is made of the same material as said second film of organic material.

3. A multi-color light-emitting element according to claim 2, wherein said first and second films of organic material are respective portions of a layer of said organic material.

4. A multi-color light-emitting element according to claim 1, wherein each said optical micro-cavity structure includes at least one further film providing a part of the optical length of the optical micro-cavity structure.

5. A multi-color light-emitting element having at least two optical micro-cavity structures, each said optical micro-cavity structure comprising at least a thin film of organic light-emitting material, at least two reflecting surfaces on opposite sides of said thin film and a path for light emission from said optical cavity structure, each said optical micro-cavity structure having an optical length determined by the spacing of said two reflecting surfaces thereof, wherein said optical lengths of said at least two optical micro-cavity structures are different from one another so that said optical micro-cavity structures emit light at different wavelengths provides multi-color light emission.

6. A multi-color light-emitting element according to claim 5, wherein each said optical micro-cavity structure comprises, between said two reflecting surfaces thereof, at least one further film selected from a transparent electrode, a hole-injection film, an electron-injection film and a transparent spacer film.

7. A multi-color light-emitting element according to claim 6, wherein the thickness of said further film in a first one of said optical micro-cavity structures is different from the thickness of said further film in a second one of said optical micro-cavity structures, thereby to provide said different optical lengths.

8. A multi-color light-emitting element according to claim 5, wherein in each said optical micro-cavity structure, said film of light-emitting material has the same thickness.

9. A multi-color light-emitting element according to claim 5, wherein each said micro-cavity structure comprises a pair of electrodes for passing electrical current through said film of organic material.

10. A multi-color light-emitting element according to claim 5, wherein said optical micro-cavity structures are mounted on a common substrate.

11. A multi-color light-emitting element according to claim 5, wherein said path for light emission from each said optical micro-cavity structure is provided by a half-mirror which also provides one of said reflecting surfaces.

12. A multi-color light-emitting element according to claim 7, wherein the thickness of the further film in the first one of said optical micro-cavity structures is 190 nm and the thickness of the further film in the second one of said optical micro-cavities is 160 nm so that the first micro-cavity generates red light and the second micro-cavity generates green light.

13. A multi-color light-emitting element according to claim 7, wherein the thickness of the further film in the first one of said optical micro-cavities is 160 nm and the thickness of the further film in the second one of said optical micro-cavities is 140 nm so that the first micro-cavity generates green light and the second micro-cavity generates blue light.

14. A multi-color light-emitting element having a substrate and, formed on said substrate, a plurality of pixels of each of at least two types respectively emitting light of different wavelength from one another to provide multi-color emission, each said pixel having an optical micro-cavity structure including, as a light-emitting region, a thin film of organic material for emitting light of the wavelength of the pixel, said optical micro-cavity structure having an optical length determining the peak wavelength of the light emitted by it under resonant condition.

15. A multi-color light-emitting element according to claim 14, wherein each of said pixels includes, in said micro-cavity structure, a pair of electrodes for passing current through said thin film of organic material to cause light emission therein, said electrodes of said pixels being interconnected as an array.

16. A substrate for use in the manufacture of a multi-color light emitting element having a plurality of micro-cavities having optical lengths different from one another to provide multi-color light emission, comprising a transparent substrate, a half mirror structure formed on said substrate and comprised of a plurality of dielectric films and a transparent conductive layer formed on said half mirror structure.

17. A substrate according to claim 16, wherein said half mirror structure has a reflectance in the range of 50% to 99.9%.

18. A multi-color light-emitting element according to claim 11, wherein said half mirror has a reflectance in the range of 50% to 99.9%.

19. A multi-color light-emitting element comprising:
   a semitransparent reflective layer;
   a plurality of transparent conductive first electrodes formed as strips extending parallel to each other in a first direction;

an organic light-emitting layer of substantially constant thickness formed over said plurality of transparent conductive first electrodes; and a plurality of second electrodes formed as strips extending over the organic light-emitting layer in a second direction, substantially perpendicular to said first direction, such that portions where the first electrodes intersect the second electrodes form pixels for emission of light from optical micro-cavities formed between the second electrodes and the semitransparent conductive first electrodes have different thicknesses from one another to provide different optical lengths of the optical micro-cavities corresponding thereto to thereby emit light at different wavelengths from one another to provide multi-color emission.

20. A multi-color light-emitting element comprising:

a semitransparent reflecting layer;

a plurality of transparent conductive first electrodes formed as strips extending parallel to each other in a first direction;

an organic light-emitting layer of substantially constant thickness formed over said plurality of transparent conductive first electrodes; and a plurality of spacers formed between said semitransparent reflective layer and said first electrodes, wherein said spacers have different thicknesses from one another to provide different optical lengths of the optical micro-cavities corresponding thereto to thereby emit light at different wavelengths from one another to provide multi-color emission.

21. A multi-color light-emitting element according to claim 19, wherein said semitransparent reflective layer is a multi-layer structure comprised of alternating layers of $TiO_2$ and $SiO_2$.

22. A multi-color light-emitting element according to claim 20, wherein said semitransparent reflective layer is a multi-layer structure comprised of alternating layers of $TiO_2$ and $SiO_2$.

23. A multi-color light-emitting element according to claim 19, wherein said semitransparent reflective layer has a reflectance in a range between 50% and 99.9%.

24. A multi-color light-emitting element according to claim 20, wherein said semitransparent reflective layer has a reflectance in a range between 50% and 99.9%.

25. A multi-color light-emitting element according to claim 19, wherein three of said transparent conductive first electrodes in three of said optical micro-cavities have respective thicknesses of 190 nm, 160 nm and 145 nm to provide different optical lengths so that the three micro-cavities respectively generate red, green and blue light.

26. A multi-color light-emitting element comprising:

a semitransparent reflective layer;

a plurality of transparent conductive first electrodes formed as strips extending parallel to each other in a first direction; and an organic light-emitting layer of substantially constant thickness formed over said plurality of transparent conductive first electrodes;

wherein a first one of said transparent conductive first electrodes is formed directly on said semitransparent reflective layer to provide a first optical cavity having a first optical length such that said first optical micro-cavity emits light of a first wavelength, wherein a second one of said transparent conductive first electrodes is formed on a first spacer having a first predetermined thickness to provide a second optical micro-cavity having a second optical length so that said second optical micro-cavity emits light of a second wavelength, and wherein a third one of said transparent conductive first electrodes is formed on a second spacer having a second predetermined thickness to provide a third optical micro-cavity having a third optical length so that said third optical micro-cavity emits light of a third wavelength.

27. A multi-color light emitting element according to claim 26, wherein said first predetermined thickness of said first spacer is 18 nm, wherein the second predetermined thickness of the second spacer is 54 nm, and wherein the first wavelength of the first micro-cavity is 470 nm to provide blue light, the second wavelength of the second micro-cavity is 520 nm to provide green light, and the third wavelength of the third micro-cavity is 620 nm to provide red light.

* * * * *